INVENTOR
M. SHOJI
BY
Arthur J. Torsiglieri
ATTORNEY

United States Patent Office 3,452,222

Patented June 24, 1969

3,452,222

CIRCUITS EMPLOYING SEMICONDUCTIVE DEVICES CHARACTERIZED BY TRAVELING ELECTRIC FIELD DOMAINS

Masakazu Shoji, Plainfield, N.J., assignor to Bell Telephone Laboratories, Incorporated, Murray Hill, N.J., a corporation of New York Filed Feb. 1, 1967, Ser. No. 613,205
Int. Cl. H03k *19/08*
U.S. Cl. 307—299 11 Claims

ABSTRACT OF THE DISCLOSURE

Additional connections are provided between the cathode and anode of a two-valley semiconductor pulse generator to provide current paths shunting the region of the traveling electric field domain selectively when it passes such connection. This permits the controlled insertion of additional current in an external circuit connected between the cathode and anode. Parallel to series conversion and arithmetic and logic functions are achieved.

This invention relates to apparatus for creating pulses involving the use of high-field traveling domains created by a voltage controlled differential negative resistance characteristic. Such a characteristic for example is involved in two-valley semiconductive devices, phonon-electron interaction devices and field-dependent trapping rate devices. Since the same basic principles are involved for all the voltage-controlled differential negative resistance devices, the invention will be discussed specifically with reference only to two-valley semiconductor devices in the interest of brevity.

The term "two-valley semiconductor device" is now widely used to describe a device which employs as the active element a wafer of a two-valley compound semiconductor in which the transfer of high energy electrons between conduction-band valleys with different mobilities and separated in energy produces electrical instabilities. The basic theory of such devices is set forth in detail in a number of papers in the special issue of semiconductor bulk-effect and transmit time devices of the I.E.E.E. Transactions on Electron Devices, Jan. 1966.

In particular, it is known that if the voltage applied to a suitable wafer or element of an appropriate semiconductor, such as n-type gallium arsenide, is increased, the average sample current increases almost linearly to a maximum value and then drops suddenly to between about 60 and 90 percent of the maximum value and maintains this reduced value almost constant with further increases in voltage. Moreover, in this range of reduced value, the instantaneous current waveform is found to oscillate periodically at a frequency related to the sample length.

It is now understood that the oscillatory state is associated with the creation and travel of a high electric field domain through the wafer from the negative electrode, or cathode, to the positive electrode, or anode. When the domain arrives at the anode, it disappears there and after such disappearance, another domain is nucleated at the cathode and the process is repeated so long as the applied voltage is maintained at a suitable value. More particularly, it appears that the oscillatory frequency is determined by the transit time of this traveling field domain between the cathode and anode.

This high electric field domain may be viewed as a layer, which is of considerably higher resistivity than the bulk of the wafer and which propagates between the cathode and anode, impeding the passage of current therebetween so long as it exists, with the consequence that the current between the cathode and anode is reduced for such time. I have realized that useful effects can be achieved by providing between spaced portions of the wafer at least one shunt path whose resistance relative to the resistance between such spaced portions via the wafer is high in the absence of the high field domain therein but low in the presence of the high resistivity, high field domain therein. In particular, by the provision of such a path, additional current is permitted to flow between the cathode and anode while the traveling domain is bypassed by such shunt path; and such current flow is made to establish pulses in an external circuit. By control of the shunt path, there can be controlled the generation of such pulses. By utilization of a plurality of controllable shunt paths, a variety of effects can be achieved.

The invention will be better understood from the following more detailed description taken with the accompanying drawing, in which.

Figure 1:
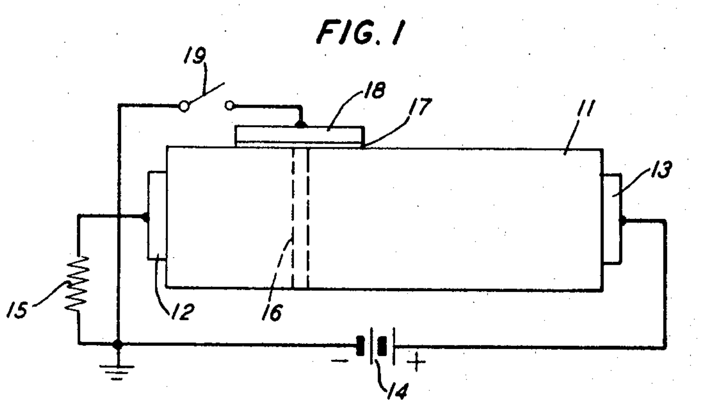
FIG. 1 shows schematically an arrangement for selectively introducing an additional pulse between successive normal pulses of a two-valley semiconductor pulse generator in accordance with one embodiment of the invention.
Figure 2:
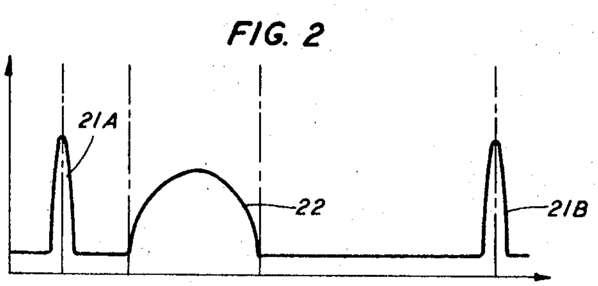
FIG. 2 illustrates the current flowing in the load in the embodiment of FIG. 1.

With referenec now to the drawing, in the arrangement shown in FIG. 1, an n-type gallium arsenide crystal 11 is provided with a cathode 12 and an anode 13 between which are connected a D-C voltage 14 and load 15. The magnitude of source 14 is sufficient for the creation and travel of a high electric field domain, shown by the broken lines 16, between the cathode and anode. Typically, the crystal may have a length of 40 mils, a width of 20 mils, and a thickness of 10 mils, and a resistivity of 3 ohm-centimeters, corresponding to a doping level of $4 \times 10^{14}$ donors per cubic centimeter. In the foregoing respects, the oscillator is of known form.

Additionally, there is attached to a portion of the crystal intermediate its two ends a layer 17 of relatively high resistivity material such as a thin layer of oxide, and over this lies electrode 18, 10 mils long and 20 mils wide, which is connected to the negative terminal of source 14 by way of a switch 19, shown open. Switch 19 normally will be an electronic switch capable of being opened and closed rapidly by control signals. With switch 19 open, layer 17 is designed so that in the presence of a traveling electric field domain in the portion of the crystal it overlies, its resistance is sufficiently lower than such portion that substantial current will tend to flow therethrough bypassing the high resistivity region of the crystal occupied by the traveling domain. Under such circumstances as the traveling domain moves past the layer 17, additional current will flow between the cathode and anode and through the load 15.

amplitude of the current flowing through the load 15. Pulses 21A and 21B correspond to the current pulses normally characteristic of a two-valley semiconductive device oscillator that occur when the successive traveling domains are extinguished at the anode. Pulse 22 is the additional current pulse arising as the traveling domain moves past layer 17.

However, with switch 19 closed, there is no appreciable effect in the current through the load 15 as the traveling domain goes past layer 17 because the increased current flows through the ground circuit bypassing the load. As a consequence, the opening of switch 19 permits the selective insertion of an additional pulse 22 in the current flowing through load 15.

It is important that the resistance of the shunt path be sufficiently high that insufficient current be drawn by it to extinguish the traveling domain. In this embodiment this can be insured by making the resistance of layer 17 high relative to the resistance of the portion of the wafer it shunts in the absence of a domain in such portion. As is disclosed in copending application Ser. No. 564,071, filed July 11, 1966, and having the same assignee as this application, the traveling domain may be extinguished by providing a low resistance connection to the wafer intermediate between the cathode and anode to reduce the electric field intensity locally to a value below that needed to sustain the traveling domain.

It should be evident that a plurality of high resistivity layers and associated electrodes may be spaced apart along the crystal between the cathode and anode to insert a plurality of additional pulses in the resulting pulse train, any of which can be deleted selectively by grounding the corresponding electrode.

Figure 3:
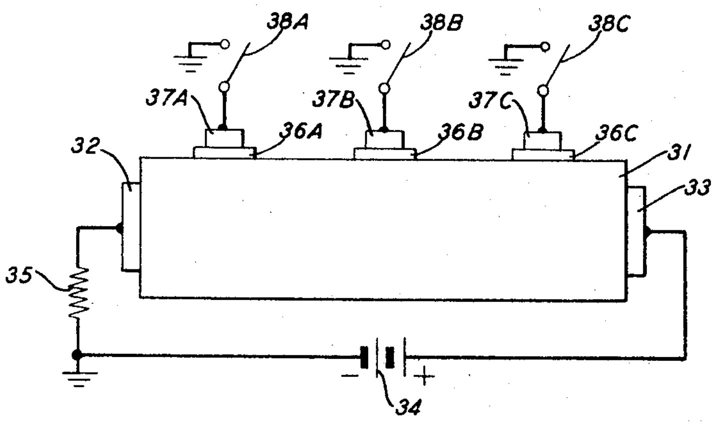
FIG. 3 shows schematically an embodiment of the invention adapted for translating time-coincident pulses on a plurality of lines to a series of pulses in a single line.

FIG. 3 shows an arrangement for converting information in the form of simultaneous pulses in a plurality of parallel lines to a series of pulses in a single line. Basically, it comprises the arrangement shown in FIG. 1 modified to include three high resistivity shunting paths, each separately controlled by one of the plurality of parallel lines. More particularly, the wafer 31 is provided with cathode 32 and anode 33, between which is connected D-C source 34 and load 35. Additionally, high resistivity layers 36A, 36B, and 36C and associated electrodes 37A, 37B, and 37C are spaced along the wafer. Associated with each electrode is a separate switch, 38A, 38B, 38C by means of which the electrode may be grounded. Each of the parallel lines on which are the pulses to be translated is used to control its individual switch, the presence of a pulse on such line serving to open the corresponding switch. If, at a given period of time, there is a pulse on each of the three lines corresponding to opening each of the switches, the current through load 35 will include three pips between the pulses normally associated with the bulk device. If, for example, there is absent a pulse on the middle line, corresponding to closing switch 38B, the middle one of the three pips will disappear. Accordingly, by increasing the number of high resistivity layers and associated control circuitry appropriately, there can be increased correspondingly the number of pulses converted from parallel to serial occurrence.

Figure 4:
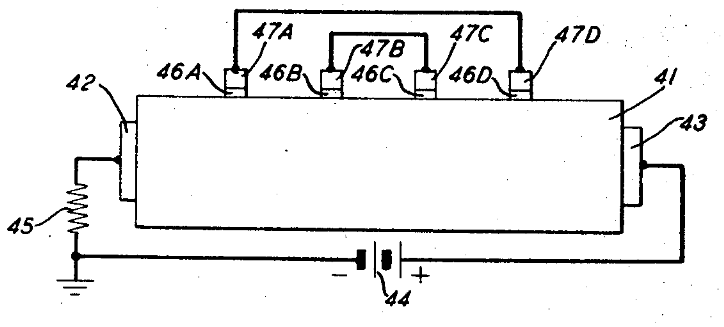
FIG. 4 shows schematically an embodiment of the invention for providing a complex current waveform.
Figure 5:
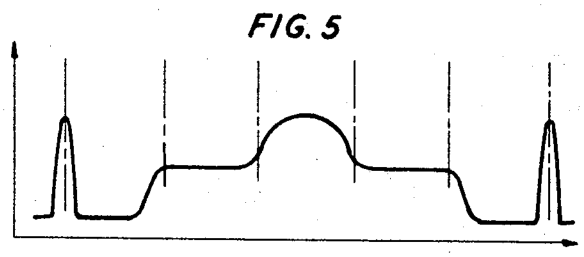
FIG. 5 illustrates the waveform provided by the arrangement of FIG. 4.

FIG. 4 shows the basic elements of an arrangement that can be employed to provide complex waveforms. It comprises an n-type gallium arsenide crystal 41 provided with cathode 42 and anode 43 between which are connected the D-C voltage source 44 and the load 45. Additionally, high resistivity layers 46A, 46B, 46C, and 46D are spaced successively along one surface of the crystal and therewith are associated respectively electrodes 47A, 47B, 47C, and 47D. Electrodes 47A and 47D are shorted together and similarly electrodes 47B and 47C are shorted together. The waveform of the resulting current through load 45 with time is shown in FIG. 5. In this arrangement, so long as the traveling domain is between layers 46A and 46D, a shunt path is provided by way of layer 46A, electrode 47A, electrode 47D, and layer 46D. Additionally so long as the traveling domain is between electrodes 46B and 46C, an additional shunt path is provided by way of layer 46B, electrode 47B, electrode 47C, and layer 46C. Accordingly, the shunt current flowing in the load will have a peak value when the domain lies between layers 46B and 46C and an intermediate value when the domain lies between layers 46A and 46B or between layers 46C and 46D. By introducing additional layers, adjusting the resistances in the associated shunt paths, and interconnecting the electrodes appropriately a variety of complex waveforms may be obtained.

It should be evident that in this embodiment, it should be feasible to eliminate the high resistance layer and to provide electrodes 47A, 47B, 47C, and 47D directly to the wafer, since the shunt path is essentially external rather than provided by the resistive layer. However, in such a case, it becomes important to insure that the effective resistance of the entire shunt path be sufficiently high that insufficient current is drawn to extinguish the traveling domain as described previously.

It should also be evident that this technique permits a pair of spaced electrodes which are interconnected by way of an external circuit to be used to achieve the results of the circuit of FIG. 1 by providing a switch in such external circuit which is closed selectively by control signals when it is desired to insert the shunt path to give rise to added current in the load.

Figure 6:
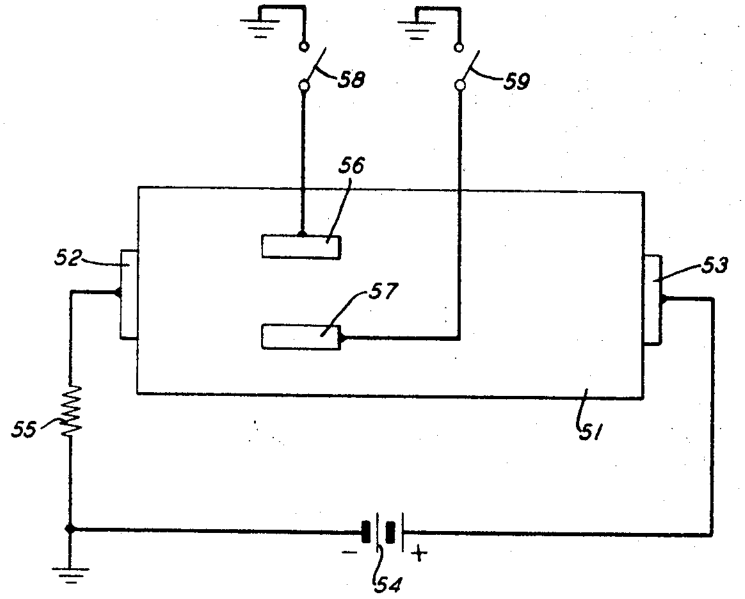
FIG. 6 shows an embodiment of the invention adapted for performing arithmetic or logic operations.

The basic concept can also be extended to use in various logic circuits. The summing or "AND" circuit of FIG. 6 includes the wafer 51, to opposite ends of which are provided cathode 52 and anode 53, between which are connected the D-C source 54 and the load 55. Coextending side by side along the wafer are provided connecting members 56 and 57, each essentially of the kind previously described to provide shunt paths as the traveling domain moves therepast. Members 56 and 57 are connected to ground by way of switches 58 and 59, each of which is separately controlled. It will be appreciated that the magnitude of the current flowing through the load 55 at the time the traveling domain moves past connecting members 56 and 57 will be determined by the states of switches 58, 59, being a maximum when both are open, a minimum when both are closed, or an intermediate value when only one is open. It can also be appreciated that the amount of current that flows through a connecting member can be controlled by the effective resistance of the shunting path. By adjusting this resistance appropriately, it is feasible to make the current flow when only one switch is open to be substantially one half that when both are open. Alternatively, it is feasible to adjust the resistance of each path so that when either of the two switches is open the current flowing is close to its value when both are open. In the latter case, the circuit is well adapted for use as an "OR" circuit. Similarly, it is feasible to employ three or more connecting members side by side for achieving similar results.

The various arrangements described can readily be adapted for optical control. In particular, the high resistance layer associated with the shunting path in such arrangements can be made of a photoconductor whose dark resistance is sufficiently high that in the dark negligible shunting action is provided, but when illuminated its resistance is reduced sufficiently that effective shunting is provided and substantial current will flow through the load when the traveling domain moves therepast.

Analogously, there could be used for the high resistivity layers layers of substantially intrinsic semiconductive material whose resistivity could be reduced selectively for effective shunting action by the injection of carriers under the control of signal information.

Similarly by utilizing layers whose resistance is nonlinear additional control of the shapes of the added pulses is provided.

It is to be understood that the specific arrangements described are merely illustrative of the general principles of the invention. Various other embodiments can be devised by a worker in the art without departing from the spirit and scope of the invention. In particular various other semiconductors may be employed so long as they may be used to establish a traveling electric field domain therein.

What is claimed is:

1. Apparatus comprising a semiconductive wafer, of the kind exhibiting a voltage controlled differential negative resistance characteristic for the creation of a traveling electric field domain, cathode and anode connections to the wafer, an external circuit connected between the cathode and anode including a load and means for establishing a traveling electric field domain in the wafer, means along the wafer providing a current path shunting a region of the wafer, the resistance of said shunt path being higher than the resistance of the region of the wafer shunted in the absence of the electric field domain in such region but lower than the resistance of the region shunted in the presence of the electric field domain in such region.

2. Apparatus in accordance with claim 1 in which the shunting path is formed external to the wafer.

3. Apparatus in accordance with claim 2 for use as a parallel to series converter further characterized in that there are included a plurality of means forming shunt paths positioned along said wafer and a plurality of means for diverting the current in said shunt paths to and from the load each under separate control.

4. Apparatus in accordance with claim 2 in which a means along the wafer provides a plurality of current paths shunting regions of the wafer of different lengths.

5. Apparatus in accordance with claim 2 in which means along the wafer provide a plurality of parallel current paths shunting coextensive regions of the wafer.

6. Apparatus in accordance with claim 2 in which the shunt path includes a layer of material contiguous with a portion of the wafer, the resistance of said layer being higher than the resistance of the region of the wafer shunted in the absence of the electric field domain in such region.

7. Apparatus in accordance with claim 1 further characterized in that means are included for diverting the current in said shunting path to and from the load under the control of signal information.

8. Apparatus in accordance with claim 7 in which each shunt path includes a layer of material contiguous with different portions of the wafer, the resistance of said layer being higher than the resistance of the region of the wafer shunted in the absence of the electric field domain in such region.

9. Apparatus in accordance with claim 1 in which the resistance of the shunt path is non-linear.

10. Apparatus in accordance with claim 1 in which the resistivity of said shunting path is sensitive to light.

11. Apparatus comprising a semiconductive wafer, of the kind exhibiting a voltage controlled differential negative resistance characteristic for the creation of a traveling electric field domain, cathode and anode connections to the wafer, an external circuit connected between the cathode and anode including a load and means for establishing a traveling electric field domain in the wafer, means along the wafer providing a current path shunting a region of the wafer, the resistance of said shunt path being nonlinear and lower than the resistance of the region shunted in the presence of the electric field domain in such region.

References Cited

UNITED STATES PATENTS 3,365,583 1/1968 Gunn -------------- 317—234

JOHN W. HUCKERT, *Primary Examiner.*

JERRY D. CRAIG, *Assistant Examiner.*

U.S. Cl. X.R.

307—218; 317—235; 331—107